United States Patent
Kasai et al.

(10) Patent No.: US 8,944,550 B2
(45) Date of Patent: Feb. 3, 2015

(54) ELEMENT SUBSTRATE, PRINTHEAD, AND PRINTING APPARATUS

(71) Applicant: Canon Kabushiki Kaisha, Tokyo (JP)

(72) Inventors: Ryo Kasai, Tokyo (JP); Nobuyuki Hirayama, Fujisawa (JP); Makoto Takagi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/286,098

(22) Filed: May 23, 2014

(65) Prior Publication Data
US 2014/0354720 A1 Dec. 4, 2014

(30) Foreign Application Priority Data
May 31, 2013 (JP) .................................. 2013-116247

(51) Int. Cl.
*B41J 29/38* (2006.01)
(52) U.S. Cl.
USPC ..................................... 347/9; 347/5; 347/56
(58) Field of Classification Search
USPC ...................................... 347/5, 9, 10, 19, 56
See application file for complete search history.

(56) References Cited

U.S. PATENT DOCUMENTS

| | | | |
|---|---|---|---|
| 6,302,504 B1 * | 10/2001 | Imanaka et al. ................... | 347/9 |
| 6,773,096 B2 | 8/2004 | Mochizuki et al. | |
| 6,890,048 B2 | 5/2005 | Hirayama | |
| 6,971,735 B2 | 12/2005 | Saito et al. | |
| 7,044,572 B2 | 5/2006 | Hirayama | |
| 7,597,424 B2 | 10/2009 | Hirayama | |
| 7,740,333 B2 * | 6/2010 | Takei et al. ..................... | 347/9 |
| 7,866,798 B2 | 1/2011 | Sakurai et al. | |
| 8,147,039 B2 * | 4/2012 | Kurokawa et al. ............. | 347/56 |
| 2003/0090546 A1 | 5/2003 | Mochizuki et al. | |
| 2006/0284909 A1 | 12/2006 | Kasai et al. | |

FOREIGN PATENT DOCUMENTS

| | | |
|---|---|---|
| EP | 1 733 884 A2 | 12/2006 |
| JP | 2000-198202 A | 7/2000 |
| JP | 4183226 B | 11/2008 |
| JP | 4266460 B2 | 5/2009 |

OTHER PUBLICATIONS

European office action issued in corresponding application No. 14001629.6, dated Sep. 3, 2014—4 pages.

* cited by examiner

*Primary Examiner* — Lam S Nguyen
(74) *Attorney, Agent, or Firm* — Fitzpatrick, Cella, Harper & Scinto (57) ABSTRACT

A recent inkjet printing apparatus includes a large-capacitance capacitor to stabilize a heater power supply. The presence of this capacitor requires a long time to drop the heater voltage at the time of power shutdown or the like. For this reason, an unwanted heater current may flow during the drop. To solve this problem, in this embodiment, a high voltage logic circuit is provided near a printing element, and a terminal is provided so that a signal can directly be input to this circuit. Heater driving control is performed via the terminal. This makes it possible to reliably control the heater regardless of the logic power supply state even if the logic voltage abruptly drops at the time of power shutdown or the like.

13 Claims, 12 Drawing Sheets

| A | B | OUT |
|---|---|---|
| Low | Low | High (HEAT DRIVING) |
| Low | High | Low (HEAT INHIBITION) |
| High | Low | Low (HEAT INHIBITION) |
| High | High | Low (HEAT INHIBITION) |
| INDEFINITE | Low | INDEFINITE (HEAT CONTROL IS NOT PERFORMED) |
| INDEFINITE | High | Low (HEAT INHIBITION) |

| IN | INB | OUT |
|---|---|---|
| Low | Low | INDEFINITE (INHIBITION LOGIC) |
| Low | High | Low |
| High | Low | High |
| High | High | INDEFINITE (INHIBITION LOGIC) |

ELEMENT SUBSTRATE, PRINTHEAD, AND PRINTING APPARATUS

BACKGROUND OF THE INVENTION

1. Field of the Invention

The present invention relates to an element substrate, a printhead, and a printing apparatus, particularly to, for example, a full-line printhead which includes an element substrate integrated thereon and prints in accordance with an inkjet method and a printing apparatus for printing by using the same. The present invention more specifically relates to a printhead including an element substrate in which a plurality of printing elements and a driving circuit configured to drive the printing elements are provided on the single element substrate and a printing apparatus.

2. Description of the Related Art

For example, as information output apparatuses such as a word processor, a personal computer, and a facsimile apparatus, in general, printing apparatuses for printing any desired information such as characters and images on a sheet-like print medium such as a paper sheet or a film are widely used.

Some of these printing apparatuses use an inkjet printhead (to be referred to as a printhead hereinafter) that prints using thermal energy. This printhead includes printing elements (heaters) provided at portions communicating with orifices for discharging ink droplets. A current is supplied to the printing elements to cause the heaters to generate heat. Ink droplets are discharged by film boiling of ink, and printing is performed. Such a printhead can arrange a number of orifices and printing elements (heaters) at high densities, and a high-resolution image can thus be printed.

Figure 14:
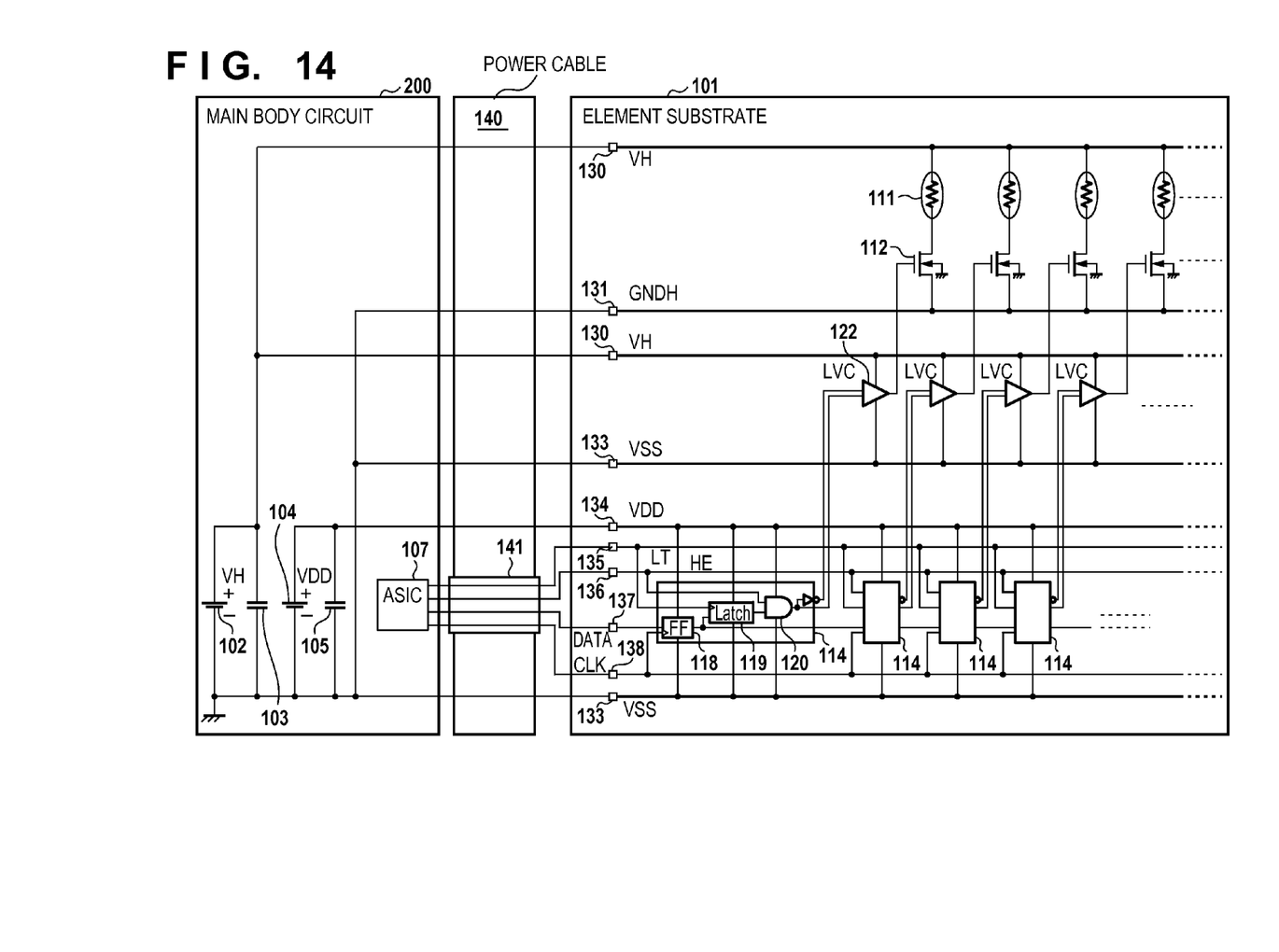
FIG. 14 is a circuit diagram showing the arrangement of an element substrate integrated on a conventional inkjet printhead.

FIG. 14 is a circuit diagram showing the arrangement of an element substrate integrated on a conventional inkjet printhead.

As shown in FIG. 14, an element substrate 101 is connected to a main body circuit 200 of a printing apparatus via a power cable 140. A heater voltage VH is thus applied to a plurality of heaters (printing elements) 111 via a pad 130. Note that a ground voltage GNDH is applied to a pad 131. An ASIC 107 of the main body circuit 200 supplies a data signal (DATA), a clock signal (CLK), a latch signal (LT), and a heat enable signal (HE) to logic circuits 114 via a signal cable 141 and pads 135 to 138. Note that the plurality of logic circuits 114 have the same circuit arrangement including a flip-flop circuit 118, a latch circuit 119, and an AND circuit 120.

In each logic circuit 114, the flip-flop circuit 118 receives the data signal (DATA) input in synchronism with the clock signal (CLK). The data signal (DATA) received by the flip-flop circuit 118 is received and held by the latch circuit 119 in synchronism with the latch signal (LT) input via the pad 135. On the other hand, the heat enable signal (HE) that defines a heater driving period is input to the pad 136. The AND circuit 120 obtains the logical product (AND) between the heat enable signal (HE) and the output of the latch circuit 119, and outputs the result to a level converter (LVC) 122 as a selection signal.

The element substrate 101 includes an enormous number of elements to be driven, as compared to the element substrate of a general power device. The number of printing elements (heaters) 111 connected to a heater power supply 102 is several thousands to ten thousand per substrate. Since corresponding driving elements 112 are provided as many as the heaters 111, the number of level converters 122 essential to drive the driving elements 112 is enormous as well. For this reason, power consumption of the level converters 122 leads to heat generation from the element substrate 101, greatly affecting the print characteristic. Hence, a 2-input circuit of a differential input type, which consumes no standby power, is widely used as the level converter (LVC) 122.

To meet a recent requirement to speed up an inkjet printing apparatus, the number of driven heaters per unit time increases. The main body circuit 200 includes a large-capacitance capacitor 103 to stabilize the power supply, thereby implementing stable power supply. In addition, a capacitor 105 is provided for a logic circuit power supply 104 as well for stable voltage supply.

However, in a case where a large-capacitance capacitor is provided, to turn off the power supply voltage takes time.

Figure 15:
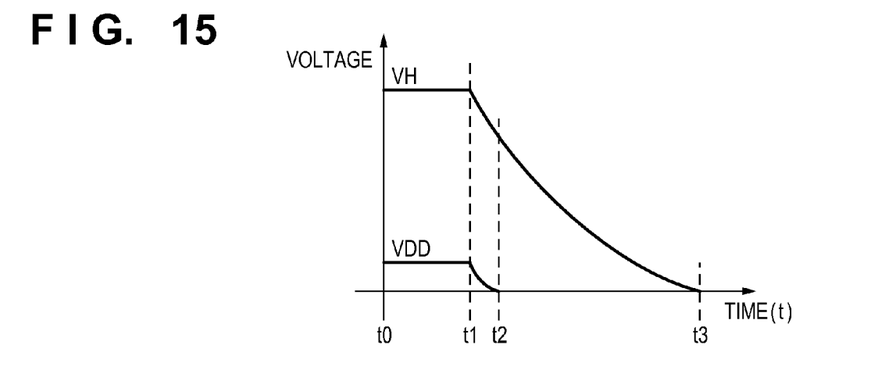
FIG. 15 is a graph showing time-rate changes in voltage drop of a power supply voltage VH and a logic voltage VDD after power shutdown.

FIG. 15 is a graph showing time-rate changes in voltage drop of the heater voltage VH and a logic voltage VDD after power shutdown.

As shown in FIG. 15, when the main body circuit 200 is shut down due to, for example, a power failure (t=t1), a state in which a voltage is applied to the heaters 111 continues long until charges accumulated in the capacitor 103 are discharged. For this reason, it is necessary to continuously control the driving elements 112 so as not to supply an unwanted current to the heaters 111 as much as possible until the heater voltage VH drops to "0" (t=t3).

As an arrangement for preventing supply of an unwanted heater current, Japanese Patent No. 4,266,460 proposes a circuit arrangement in which a logic circuit has a reset function. In a state in which a logic power is applied (t=t0 to t1), this arrangement enables control to reliably inhibit supply of an unwanted heater current by inputting a RESET signal. Upon power shutdown (t=t1), however, the logic circuit power supply 104 completes discharge in a short period of time (t=t2), as shown in FIG. 15, because the voltage is lower than that of the heater power supply, and the capacitor 105 has a relatively small capacitance. For this reason, control by the RESET signal is immediately disabled.

On the other hand, the 2-input level converter 122 is operable even after shutdown of the logic circuit power supply 104 because the power is received from the heater power supply 102. However, when the logic voltage VDD supplied via a pad 134 drops to 0 V, and consequently, all signals from the logic circuit 114 change to 0 V, the level converter (LVC) 122 receives in-phase logics (both 0 V), and its output logic becomes indefinite.

Figure 16A:
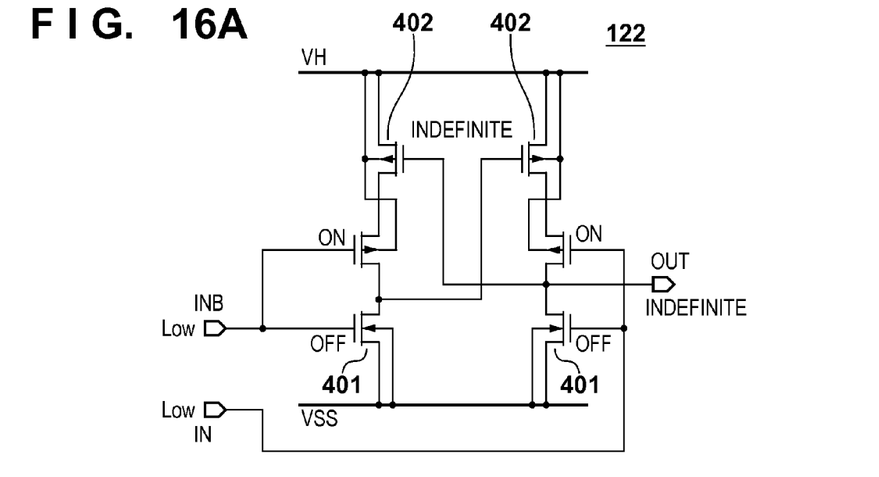
FIGS. 16A and 16B are views respectively showing the circuit arrangement and the input/output relationship of a 2-input level converter 122.
Figure 16B:
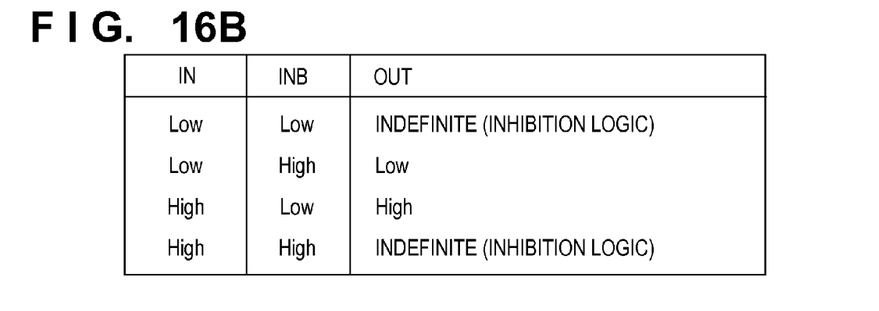

FIGS. 16A and 16B are views respectively showing the circuit arrangement and the input/output relationship of the 2-input level converter 122.

FIG. 16A is a circuit diagram showing the arrangement of the 2-input level converter 122. Referring to FIG. 16A, INB and IN represent inputs (terminals); and OUT, an output (terminal). As is apparent from comparison of FIGS. 14 and 16A, the 2-input level converter 122 receives the heater voltage VH via the pad 130, and is connected to a ground voltage VSS via a pad 133. The 2-input level converter 122 is formed from six MOSFETs.

In the above arrangement, when power is shut down as both logic voltages VDD from the logic circuit 114 become 0 V (that is, both IN and INB are at Low state), and the heater voltage VH becomes "0", both NMOSs 401 are turned off, and the gate voltages of both PMOSs 402 float. As a result, the output becomes indefinite. This corresponds to a state shown in FIG. 16B in which IN and INB are Low, and OUT is indefinite.

Hence, during the period of t=t2 to t3 in FIG. 15, if the driving elements 112 cannot be controlled, and voltages of nodes whose states are indefinite change to 0 V or more, an unwanted current may flow to the heaters. For the above-described reasons, no expected effect can be obtained by the arrangement proposed in Japanese Patent No. 4,266,460 in case of power shutdown or the like.

To solve this problem, Japanese Patent No. 4,183,226 proposes an arrangement that powers off a driving circuit portion for controlling the gate voltages of driving elements, thereby setting the input (gate) voltages of the driving elements 112 to 0 V and reliably preventing an unwanted heater current from flowing. However, this arrangement requires power to the driving circuit portion to be supplied from the heater voltage VH via a stepdown circuit. The conventional arrangement as shown in FIG. 14, which includes no stepdown circuit, cannot meet this requirement.

SUMMARY OF THE INVENTION

Accordingly, the present invention is conceived as a response to the above-described disadvantages of the conventional art.

For example, a reliable element substrate, a printhead using the same, and a printing apparatus including the printhead according to this invention are capable of, for example, preventing supply of an unwanted heater current at the time of power shutdown or the like.

According to one aspect of the present invention, there is provided an element substrate including a plurality of printing elements to which a first voltage is applied, a plurality of driving elements provided in correspondence with the plurality of printing elements and configured to drive the plurality of printing elements, a plurality of logic circuits configured to generate, based on an externally input signal, a selection signal used to select and drive the plurality of printing elements, and a plurality of first level converters provided in correspondence with the plurality of logic circuits and configured to boost a logic voltage having a second voltage lower than the first voltage of the selection signal. The element substrate comprises: a pad configured to externally receive a detection signal indicating detection of drop of the logic voltage; a second level converter configured to receive the detection signal via the pad and boost the detection signal; and a plurality of high voltage logic circuits provided in correspondence with the plurality of driving elements and the plurality of first level converters and configured to receive the boosted selection signals respectively output from the plurality of first level converters and the detection signal boosted by the second level converter, perform a logical operation of the boosted selection signals and the boosted detection signal and, output a result of the logical operation, and drive the plurality of driving elements, wherein when the detection signal is input, the plurality of high voltage logic circuits inhibit driving of the plurality of driving elements regardless of the boosted selection signals.

According to another aspect of the present invention, there is provided a printhead using an element substrate having the above arrangement, particularly, a full-line inkjet printhead which discharges ink and prints in accordance with an inkjet method.

According to still another aspect of the present invention, there is provided a printing apparatus for printing by using the above full-line printhead. The printing apparatus includes a logic circuit power supply configured to supply the logic voltage, a detection unit configured to detect drop of the logic voltage, and an output unit configured to output the detection by the detection unit to the full-line printhead as the detection signal.

The invention is particularly advantageous since control to inhibit driving of the printing elements can reliably be performed by externally inputting a detection signal indicating detection of drop of a logic voltage. This prevents supply of an unwanted current to drive the printing elements and improves the reliability of the printhead.

Further features of the present invention will become apparent from the following description of exemplary embodiments (with reference to the attached drawings).

DESCRIPTION OF THE EMBODIMENTS

Exemplary embodiments of the present invention will now be described in detail in accordance with the accompanying drawings. Note that the same reference numerals denote already explained parts, and a repetitive description thereof will be omitted.

In this specification, the terms "print" and "printing" not only include the formation of significant information such as characters and graphics, but also broadly includes the formation of images, figures, patterns, and the like on a print medium, or the processing of the medium, regardless of whether they are significant or insignificant and whether they are so visualized as to be visually perceivable by humans.

Also, the term "print medium" not only includes a paper sheet used in common printing apparatuses, but also broadly includes materials, such as cloth, a plastic film, a metal plate, glass, ceramics, wood, and leather, capable of accepting ink.

Furthermore, the term "ink" (to be also referred to as a "liquid" hereinafter) should be extensively interpreted similar to the definition of "print" described above. That is, "ink" includes a liquid which, when applied onto a print medium, can form images, figures, patterns, and the like, can process the print medium, and can process ink. The process of ink includes, for example, solidifying or insolubilizing a coloring agent contained in ink applied to the print medium.

Further, a "nozzle" generically means an ink orifice or a liquid channel communicating with it, and an element for generating energy used to discharge ink, unless otherwise specified.

An element substrate (head substrate) for a printhead to be used below indicates not a mere base made of silicon semiconductor but a component provided with elements, wirings, and the like.

"On the substrate" not only simply indicates above the element substrate but also indicates the surface of the element substrate and the inner side of the element substrate near the surface. In the present invention, "built-in" is a term not indicating simply arranging separate elements on the substrate surface as separate members but indicating integrally forming and manufacturing the respective elements on the element substrate in, for example, a semiconductor circuit manufacturing process.

An embodiment of an inkjet printing apparatus will be described next. This printing apparatus is a high-speed line printer that uses a continuous sheet (print medium) wound into a roll and supports both single-sided printing and double-sided printing. The printing apparatus is suitable for, for example, a mass print field in a print laboratory or the like.

Figure 1:
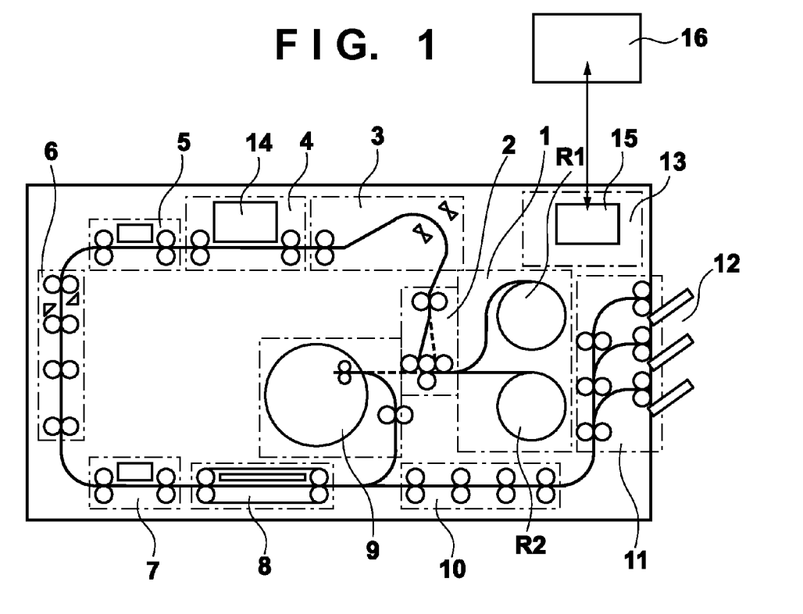
FIG. 1 is a schematic side sectional view showing the internal arrangement of an inkjet printing apparatus according to an exemplary embodiment of the present invention.

FIG. 1 is a side sectional view showing the schematic internal arrangement of an inkjet printing apparatus (to be referred to as a printing apparatus hereinafter) according to an exemplary embodiment of the present invention. The interior of the apparatus can roughly be divided into a sheet supply unit 1, a decurling unit 2, a skew adjustment unit 3, a print unit 4, a cleaning unit (not shown), an inspection unit 5, a cutter unit 6, an information printing unit 7, a drying unit 8, a sheet winding unit 9, a discharge conveyance unit 10, a sorter unit 11, a discharge tray 12, a control unit 13, and the like. A sheet is conveyed by a conveyance mechanism including roller pairs and a belt along a sheet conveyance path indicated by the solid line in FIG. 1 and undergoes processing of each unit.

The sheet supply unit 1 stores and supplies a continuous sheet wound into a roll. The sheet supply unit 1 can store two rolls R1 and R2, and is configured to selectively draw and supply a sheet. Note that the number of storable rolls is not limited to two, and one or three or more rolls may be stored. The decurling unit 2 reduces the curl (warp) of the sheet supplied from the sheet supply unit 1. The decurling unit 2 bends and strokes the sheet so as to give a warp in an opposite direction to the curl using two pinch rollers with respect to one driving roller, thereby reducing the curl. The skew adjustment unit 3 adjusts the skew (tilt with respect to the original traveling direction) of the sheet that has passed through the decurling unit 2. A sheet end on a reference side is pressed against a guide member, thereby adjusting the skew of the sheet.

The print unit 4 forms an image on the conveyed sheet by a printhead unit 14. The print unit 4 also includes a plurality of conveyance rollers configured to convey the sheet. The printhead unit 14 includes a full-line printhead (inkjet printhead) in which an inkjet nozzle array is formed within a range covering the maximum width of sheets assumed to be used. In the printhead unit 14, a plurality of printheads are arranged parallelly along the sheet conveyance direction. In this embodiment, the printhead unit 14 includes four printheads corresponding to four colors of K (black), C (cyan), M (magenta), and Y (yellow). The printheads are arranged in the order of K, C, M, and Y from the upstream side of sheet conveyance. Note that the number of ink colors and the number of printheads are not limited to four. As the inkjet method, a method using heating elements, a method using piezoelectric elements, a method using electrostatic elements, a method using MEMS elements, or the like can be employed. The respective color inks are supplied from ink tanks to the printhead unit 14 via ink tubes.

The inspection unit 5 optically reads an inspection pattern or image printed on the sheet by the print unit 4, and inspects the states of nozzles of the printheads, the sheet conveyance state, the image position, and the like. The inspection unit 5 includes a scanner unit that actually reads an image and generates image data, and an image analysis unit that analyzes the read image and returns the analysis result to the print unit 4. The inspection unit 5 includes a CCD line sensor which is arranged in a direction perpendicular to the sheet conveyance direction.

Figure 2:
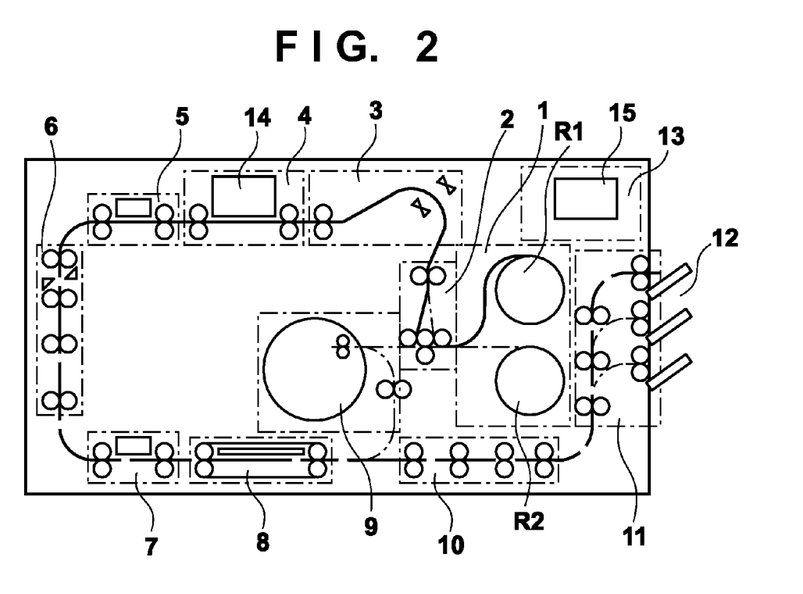
FIG. 2 is a side sectional view for explaining the single-sided printing operation of the printing apparatus shown in FIG. 1.
Figure 3:
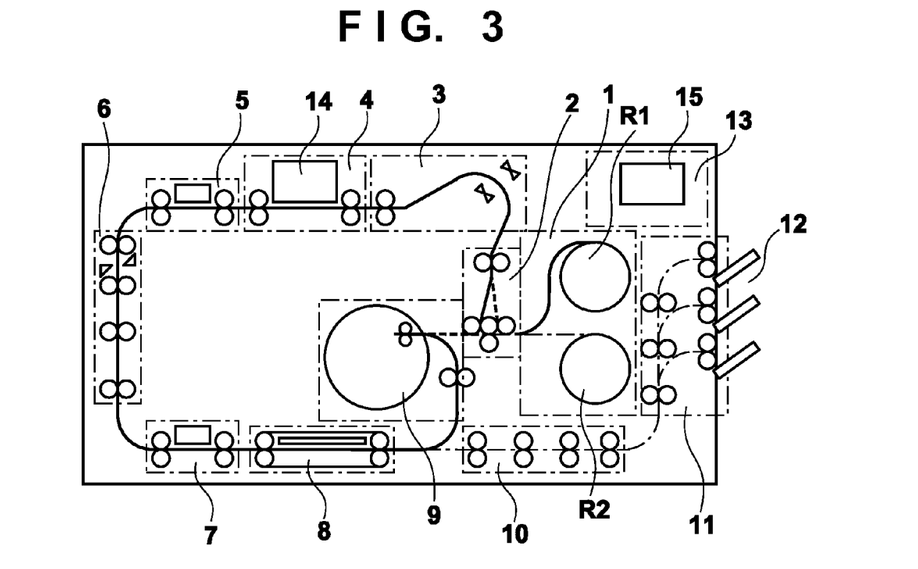
FIG. 3 is a side sectional view for explaining the double-sided printing operation of the printing apparatus shown in FIG. 1.

Note that the printing apparatus shown in FIG. 1 supports both single-sided printing and double-sided printing, as described above. FIGS. 2 and 3 are views for explaining the single-sided printing operation and double-sided printing operation of the printing apparatus shown in FIG. 1, respectively.

Figure 4:
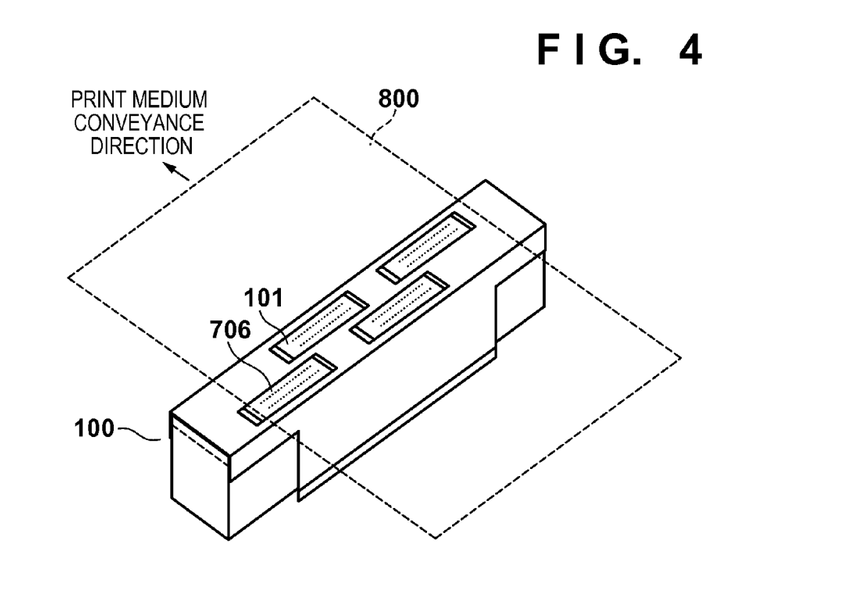
FIG. 4 is a perspective view of a full-line printhead.

FIG. 4 is a view showing the relationship between a full-line printhead 100 included in the printhead unit 14 and the conveyance direction of a print medium 800.

When performing a printing operation, the full-line printhead 100 is fixed on the printing apparatus, the print medium 800 is conveyed, and the inks are discharged from a plurality of orifices 706 provided in element substrates 101, thereby forming an image on the print medium 800.

As is apparent from FIG. 4, in this example, the full-line printhead 100 is formed by integrating four element substrates 101.

Figure 5:
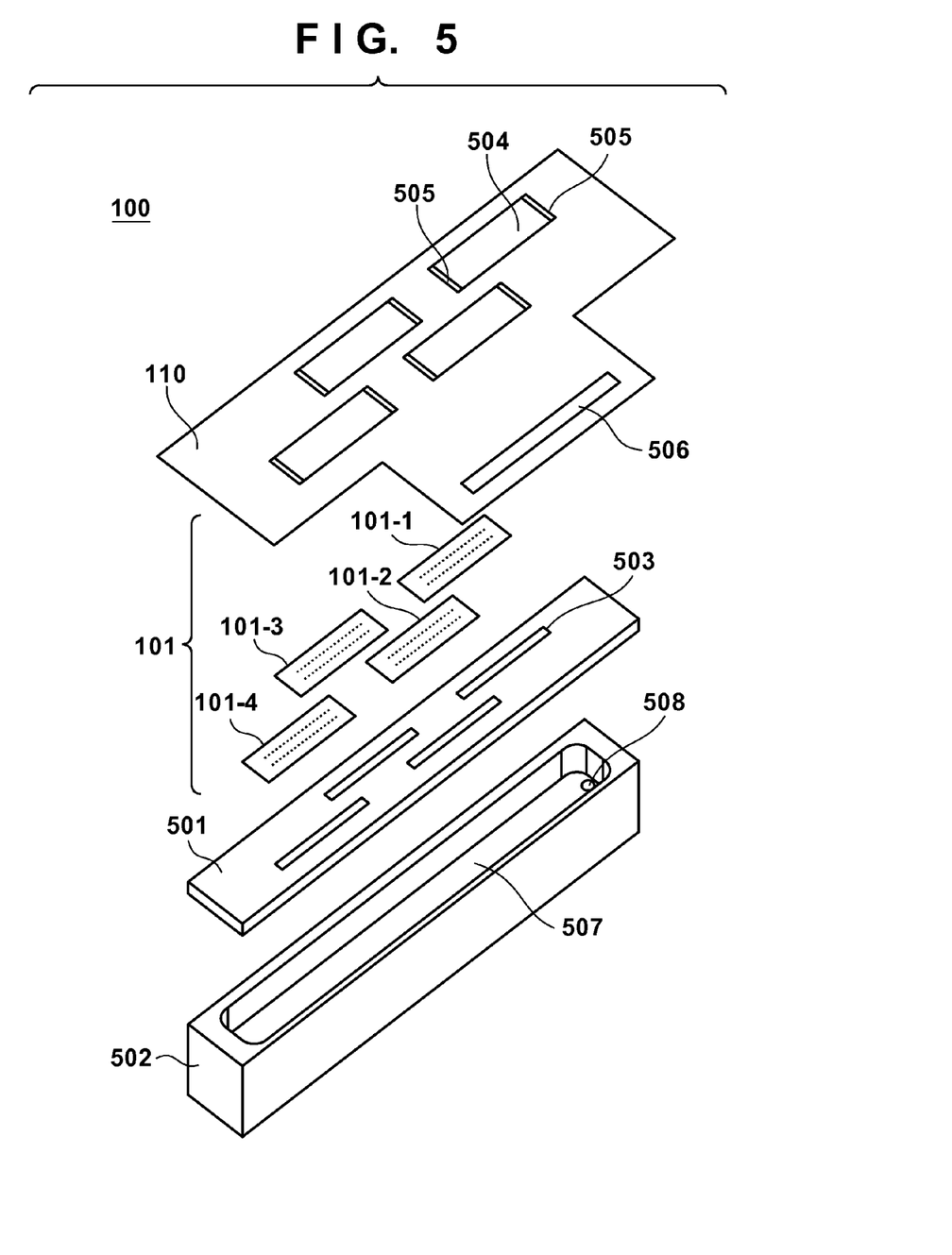
FIG. 5 is an exploded perspective view of the full-line printhead.

FIG. 5 is an exploded perspective view of the full-line printhead.

The full-line printhead 100 includes four element substrates 101-1, 101-2, 101-3, and 101-4, a support member 501, a printed board 110, and an ink supply member 502. As shown in FIG. 5, the four element substrates are arranged zigzag in the full-line printhead 100. Note that a printhead having a larger print width can be formed by increasing the number of element substrates 101 included. When explaining the four element substrates without individually specifying them, they will simply be referred to as element substrates 101.

As is apparent from FIG. 5, the printed board 110 basically has a rectangular shape, and the element substrates 101 have a rectangular shape. The plurality of orifices 706 are arrayed in the longitudinal direction of the element substrates 101. The element substrates 101 are arranged such that their longitudinal direction, that is, the arrayed direction of the plurality of orifices coincides with the longitudinal direction of the printed board 110.

Several embodiments will be described next concerning an element substrate integrated on a full-line printhead included in a printing apparatus having the above-described arrangement.

First Embodiment

Figure 6:
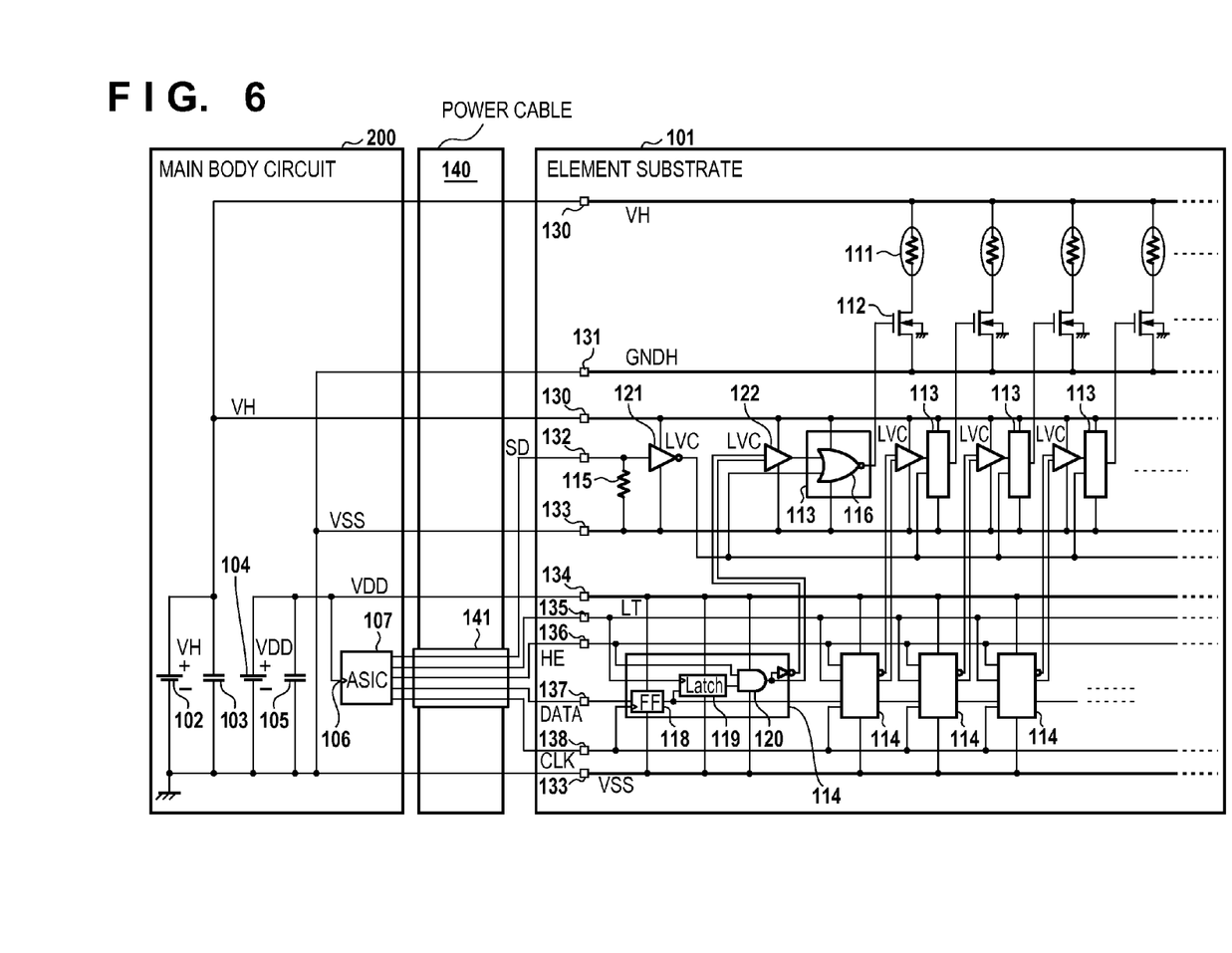
FIG. 6 is a circuit diagram showing the arrangement of an element substrate according to the first embodiment and the arrangement of a main body circuit connected to the element substrate.

FIG. 6 is a circuit diagram showing the arrangement of an element substrate according to the first embodiment and the arrangement of a main body circuit connected to the element substrate. Note that the same reference numerals or symbols as those already described with reference to FIG. 14 of the related art denote the same constituent elements or signals in FIG. 6, and a description thereof will be omitted.

An element substrate 101 shown in FIG. 6 includes a plurality of high voltage logic circuits 113, a level converter 121, and a pull-down resistor 115 in addition to the conventional components. A heater voltage VH (first voltage) is supplied to the high voltage logic circuits 113. Hence, a level converter 122 will also be referred to as a first level converter, and the level converter 121 as a second level converter.

In this embodiment as well, the final output from each logic circuit 114 is sent to a corresponding level converter (LVC) 122 as a selection signal to select a heater. The level of the signal voltage from the logic circuit 114 is raised by the 2-input level converter 122 and then input to the high voltage logic circuit 113.

The high voltage logic circuit 113 is formed from a high voltage 2-input NOR circuit 116. The circuit 116 receives a signal from the level converter 122 and a shutdown signal (SD) input from a main body circuit 200 via a pad 132 (externally when viewed from the element substrate) and leveled up via the 1-input level converter 121. The 1-input level converter 121 has an inverted output structure. The shutdown signal (SD) inhibits heat driving by Low logic (0 V). The pull-down resistor 115 is connected to the pad 132. That is, if the user unnecessarily plugs off the signal cable 141, the input logic changes to Low (0 V) to inhibit heat driving.

Figure 7:
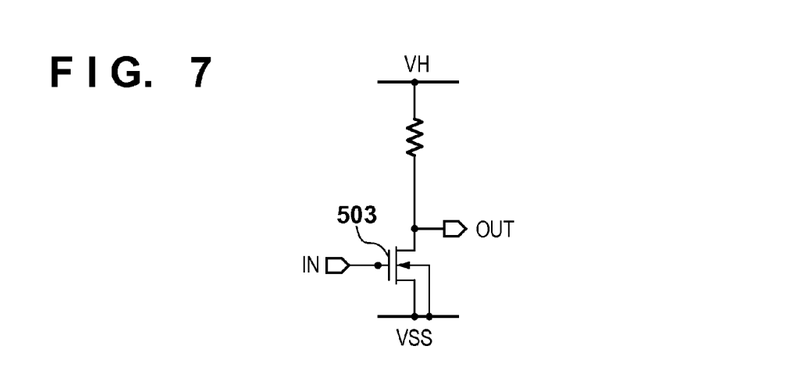
FIG. 7 is a circuit diagram showing the arrangement of a 1-input level converter.

FIG. 7 is a circuit diagram showing the arrangement of the 1-input level converter 121.

In this arrangement, when a gate signal of High level is input, an NMOS 503 is turned on, and a through current flows, unlike the 2-input level converter 122 shown in FIG. 16A. In the arrangement of this embodiment, however, since the element substrate 101 includes only one 1-input level converter 121, as shown in FIG. 6, the influence due to heat generation is small, and the print characteristic is not affected.

When power shutdown occurs in the element substrate having the arrangement shown in FIG. 6, a logic voltage VDD (second voltage) becomes "0" (zero) ahead of the heater voltage VH, as described with reference to FIG. 15 for the related art. At this time, the shutdown signal (SD) of Low level (0 V) (that is, active logic) is input to the pad 132. Note that the heater voltage VH is much higher than the logic voltage VDD, as is apparent from FIG. 15. In general, the heater voltage VH is about 18 to 24 V, and the logic voltage VDD is 3.3 or 5 V.

On the other hand, all signals output from the logic circuit 114 change to Low (0 V), and the 2-input level converter 122 receives in-phase signals of 0 V so that the state as shown in FIG. 16B is attained in which the logic of output (OUT) becomes indefinite, as in the related art. At this time, signals of indefinite logic and High level are input to the two inputs of the high voltage 2-input NOR circuit 116, respectively.

Figure 8A:
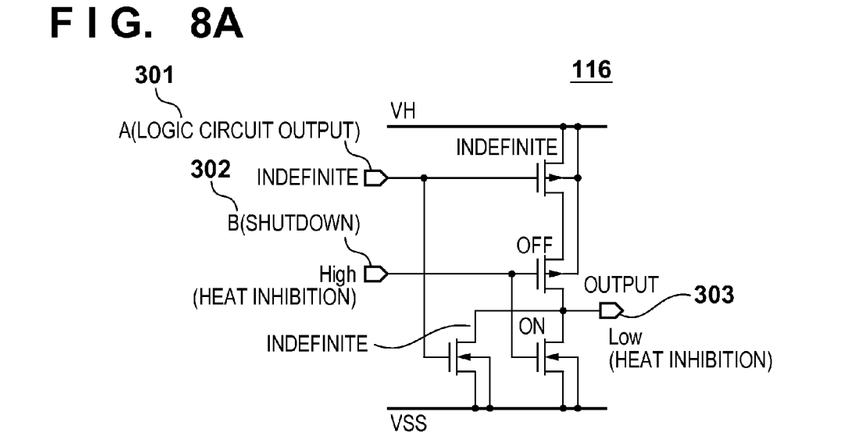
FIGS. 8A and 8B are views respectively showing the arrangement and the input/output relationship of a 2-input NOR circuit.
Figure 8B:
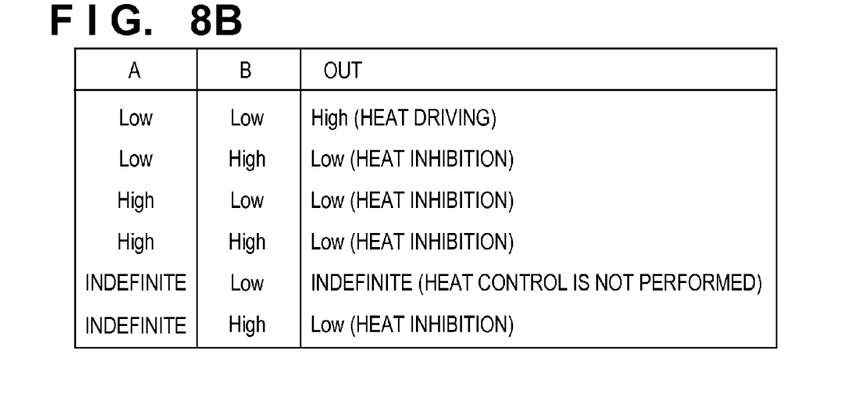

FIGS. 8A and 8B are views respectively showing the arrangement and the input/output relationship of the 2-input NOR circuit 116.

FIG. 8A shows a state in which a signal of indefinite logic and the shutdown signal (SD) of High level of active logic are input to input terminals 301 and 302 of the 2-input NOR circuit 116, respectively.

As indicated by the circuit arrangement of FIG. 8A, even when the logic of one of the two inputs is indefinite (the logic of the input signal to the terminal 301 is indefinite), the switch from VH is reliably turned off as far as the logic of the other input is High (the logic of the input signal to the terminal 302 is High). Since the switch to GND (VSS side) is reliably turned on, the output logic is determined as Low. In this embodiment, coping with a case where the output logic of the 2-input level converter 122 becomes indefinite, reliable heat inhibition control is performed using the circuit characteristic of the 2-input NOR circuit in the above-described way. This is based on the input/output relationship on the lowermost line of FIG. 8B. Referring to FIG. 8B, A indicates the level of a signal input to the terminal 301 of the 2-input NOR circuit 116; and B, the level of a signal input to the terminal 302.

The logic of the high voltage 2-input NOR circuit 116 needs to inhibit heater driving by inputting a signal of High level and outputting a signal of Low level when the shutdown signal (SD) is active. Even when the logic circuit power supply voltage VDD is 0, influence on the logic of the shutdown signal (SD) needs to be avoided. It is also necessary to avoid intervention of any logic circuit using the logic circuit power supply voltage VDD in the path from the pad 132 to the input of the level converter 121, as a matter of course, and disconnect an input protection (electrostatic) circuit (not shown) from the logic circuit power supply voltage VDD.

An ASIC (element substrate control unit) 107 of the main body circuit 200 is provided with a voltage detection input terminal 106 for the logic circuit power supply voltage VDD. With this arrangement, the start of drop of the logic circuit power supply voltage is detected, and the shutdown signal (SD) of Low level of active logic, which serves as a detection signal, is output to the pad 132.

Hence, according to this embodiment, the shutdown signal (SD) is input from the main body circuit 200 to the element substrate 101 in advance. This makes it possible to perform reliable heat inhibition control during the time (t=t1 to t2) when the voltage of the logic circuit power supply 104 falls.

Figure 9:
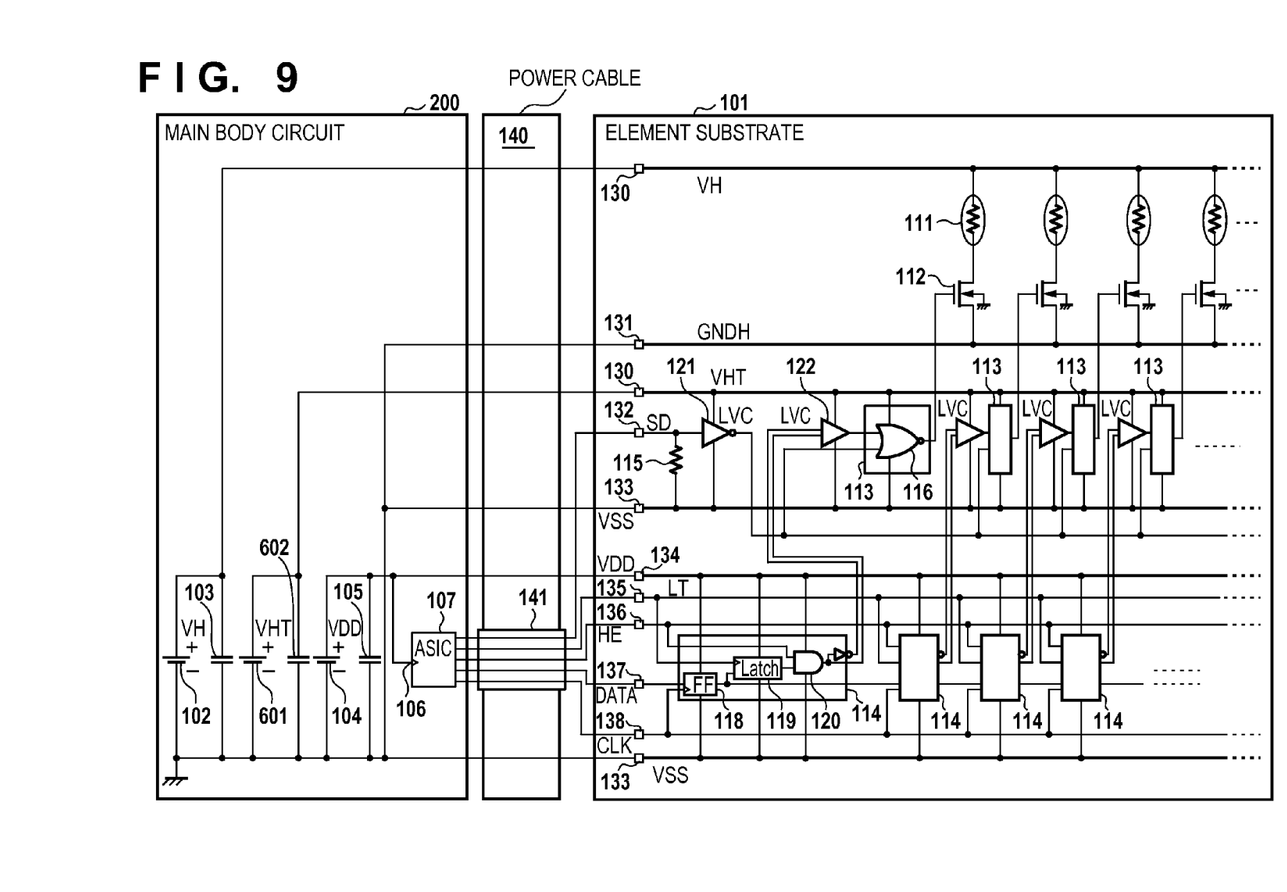
FIG. 9 is a circuit diagram showing the arrangement of an element substrate according to a modified example of the first embodiment and the arrangement of a main body circuit connected to the element substrate.

FIG. 9 is a circuit diagram showing the arrangement of an element substrate according to a modified example of the first embodiment and the arrangement of a main body circuit connected to the element substrate. Note that the same reference numerals or symbols as those already described with reference to FIG. 14 of the related art or FIG. 6 denote the same constituent elements or signals in FIG. 9 as well, and a description thereof will be omitted.

As is apparent from comparison of FIGS. 9 and 6, a voltage (VHT: third voltage) lower than the heater voltage is applied to the high voltage logic circuits 113 and the level converters 121 and 122. This arrangement is different from that shown in FIG. 6 in that the main body circuit 200 includes a high voltage logic power supply 601 and a capacitor 602.

Figure 10:
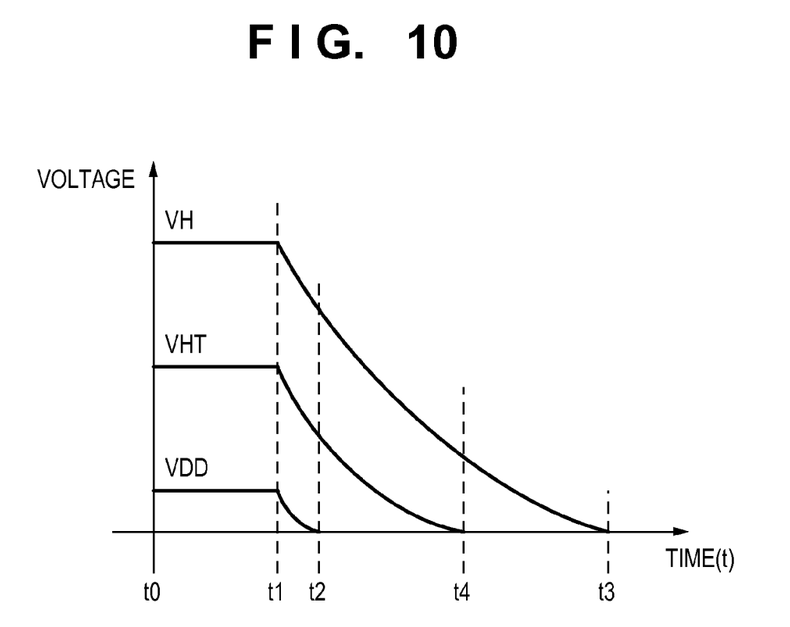
FIG. 10 is a graph showing time-rate changes in voltage drop of a heater voltage VH, a voltage VHT applied to high voltage logic circuits and level converters, and a logic voltage VDD after power shutdown.

FIG. 10 is a graph showing time-rate changes in voltage drop of the heater voltage VH, the voltage VHT applied to the high voltage logic circuits and the level converters, and the logic voltage VDD after power shutdown.

As shown in FIG. 10, when power shutdown occurs in the main body circuit 200, the voltages drop. In this case, control is performed not to supply an unwanted heater current during the period of t=t2 to t4. However, the control is not performed during the period of t=t4 to t3. However, in the arrangement of this modified example as well, the heater voltage VH at t=t4 is lower than that at t=t2. Hence, even if an unwanted heater current flows, the heat generation amount is small, and the reliability of the printhead (element substrate) improves.

Note that although an example assuming power shutdown has been explained in this embodiment, the shutdown signal may be used at the time of, for example, heat driving halt due to a mechanical error (for example, paper jam) in the printing apparatus main body, data transfer error, or chip heat generation. As compared to Japanese Patent No. 4,266,460 that proposes heat inhibition control by a logic circuit, this embodiment is advantageous because heat inhibition control is performed by a circuit closer to a driving element 112, and the reliability is high. In addition, since the high voltage logic circuit 113 driven by a high voltage directly performs heat inhibition control, tolerability to noise is very high.

When the heat inhibition control circuit is designed using the same power supply as the heater power supply voltage, as shown in FIG. 6, no unwanted heater current flows as long as a high voltage is applied to the heater.

In this embodiment, a 2-input NOR circuit is used as the high voltage logic circuit 113. However, a circuit having a NAND configuration may be used. However, when a NAND circuit is used, it is necessary to design a logic circuit that receives, by at least one input, the shutdown signal (SD) that changes to active Low, and outputs a High-level signal to turn off the driving element 112. For this reason, the number of elements increases as compared to the arrangement shown in FIG. 6.

Second Embodiment

Figure 11:
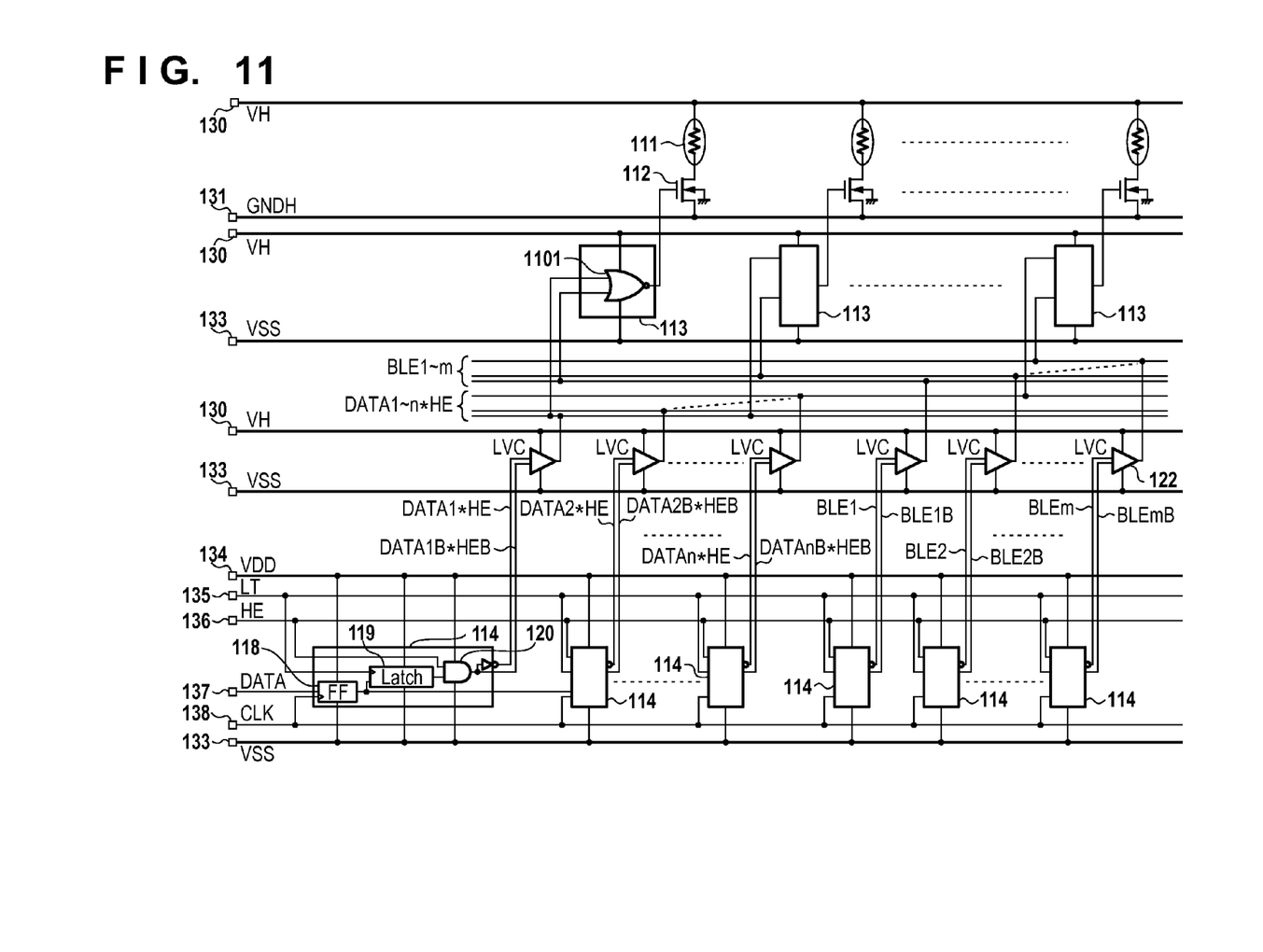
FIG. 11 is a circuit diagram showing an example of the arrangement of a conventional element substrate serving as a comparative example for explaining the second embodiment.

FIG. 11 is a circuit diagram showing an example of the arrangement of a conventional element substrate serving as a comparative example for explaining the second embodiment.

The circuit shown in FIG. 11 is compared with that shown in FIG. 14. In this example, an arrangement for performing matrix selection of heaters (printing elements) 111 is employed, thereby decreasing the numbers of logic circuits 114 and level converters 122 and the number of bits of a data signal (DATA). Note that the same reference numerals or symbols as those already described with reference to FIG. 14 denote the same constituent elements or signals in FIG. 11 as well, and a description thereof will be omitted.

According to this arrangement, after the output voltage of the logic circuit 114 is leveled up by the 2-input level converter 122, a high voltage 2-input NOR circuit 1101 performs a logical operation. The data signal (DATA) and a heat enable signal (HE) are input to one input of the 2-input NOR circuit 1101, and a block selection signal (BLE) is input to the other input. A heater to be driven is selected by the data signal (DATA) and the block selection signal (BLE). This will be referred to as a matrix selection configuration. When a logical operation is performed by a high voltage, the number of 2-input level converters 122 on the element substrate decreases, as compared to the arrangement shown in FIG. 14. One 2-input level converter 122 is formed from six MOSFETs, as shown in FIG. 16A, and has a large circuit layout size. Hence, the matrix configuration shown in FIG. 11 is employed to reduce the substrate size.

Figure 12:
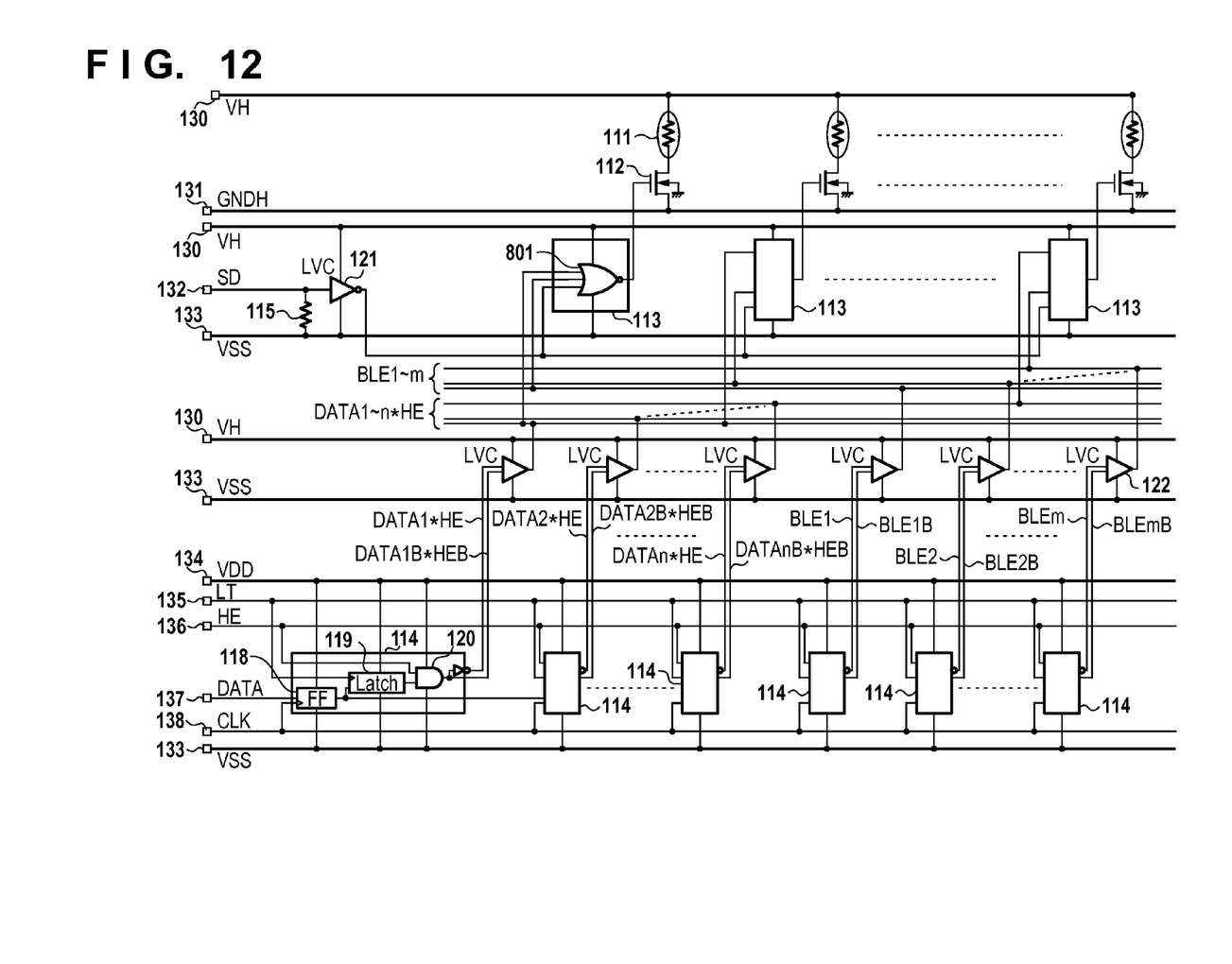
FIG. 12 is a circuit diagram showing the arrangement of an element substrate according to the second embodiment.

FIG. 12 is a circuit diagram showing the arrangement of an element substrate according to the second embodiment.

As shown in FIG. 12, this example is configured to handle input of a shutdown signal (SD) while implementing substrate size reduction by employing the same matrix configuration as in FIG. 11. Note that the same reference numerals or symbols as those already described with reference to FIG. 14 or 11 denote the same constituent elements or signals in FIG. 12 as well, and a description thereof will be omitted.

In this embodiment, a high voltage logic circuit 113 is formed from a 3-input NOR circuit 801, as shown in FIG. 12. In the arrangement of the 3-input NOR circuit as well, when the shutdown signal (SD) goes high, the Low logic is reliably determined even when the logics of the remaining terminals are indefinite, like the 2-input NOR circuit (that is, as in FIG. 6). In the second embodiment as well, heat inhibition control is performed in this way using the circuit characteristic of the NOR circuit, as in the first embodiment.

However, as compared to the 2-input NOR circuit employed in the first embodiment, since three PMOSs are connected in series, the resistance may rise, and the through rate (only pulse rise) of the output signal to the driving element may lower. In addition, since four elements are connected between a heater voltage VH and a ground voltage VSS, the minimum voltage of the heater voltage VH that enables a normal operation may also be lower than in the arrangement of the 2-input NOR circuit. Therefore, care must be taken for that.

Note that although pads 130 and 133 of the high voltage logic circuits 113 and the level converters 122 are separated in the circuit shown in FIG. 12, they may be shared in the substrate.

A circuit having the same effect can also be formed using a 3-input NAND circuit. In this arrangement, however, an inverter needs to be inserted to the output of the NAND circuit, and the substrate size becomes large.

Third Embodiment

Figure 13:
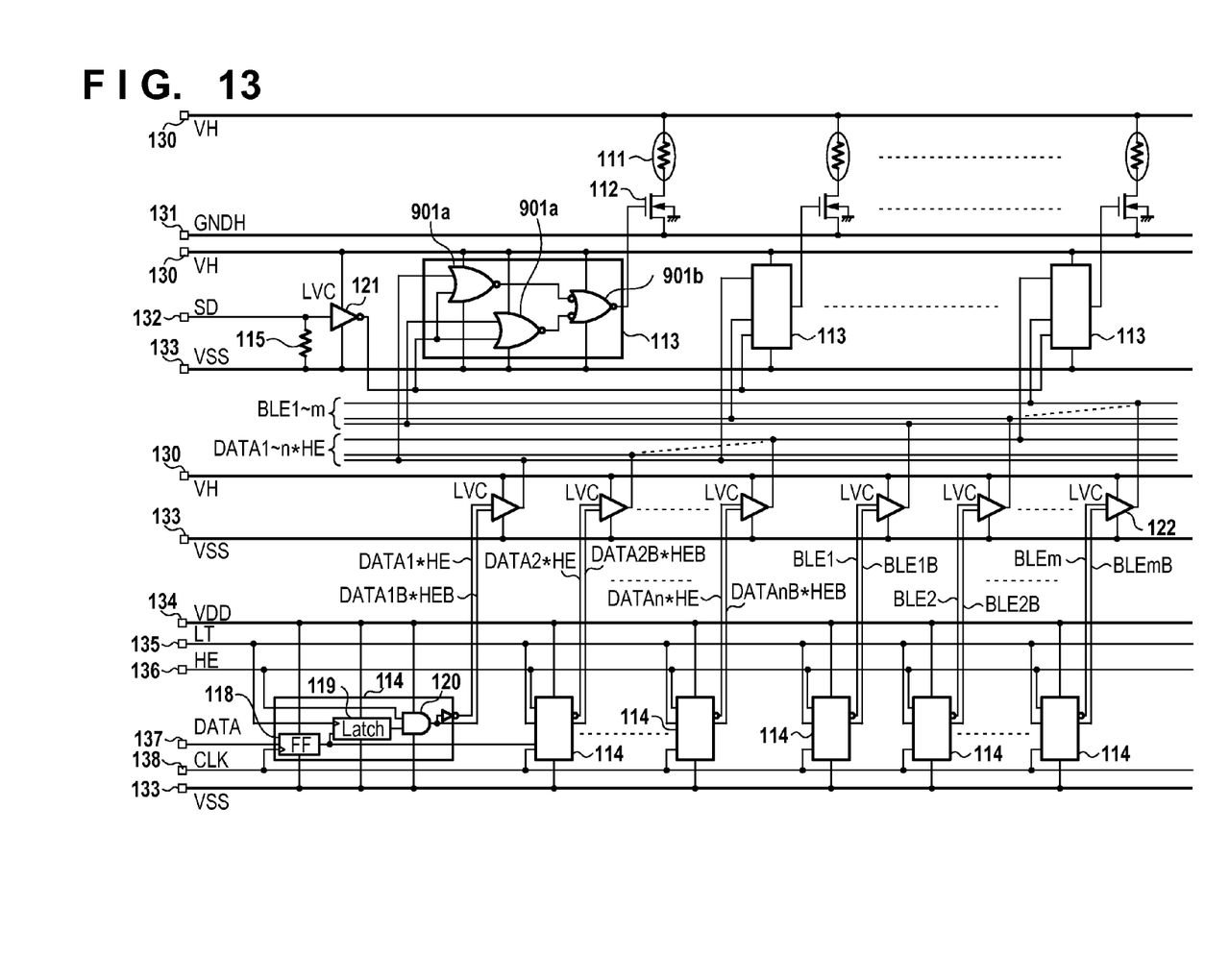
FIG. 13 is a circuit diagram showing the arrangement of an element substrate according to the third embodiment.

FIG. 13 is a circuit diagram showing the arrangement of an element substrate according to the third embodiment.

As is apparent from comparison of FIGS. 13 and 12, only the internal arrangement of a high voltage logic circuit 113 is different from the second embodiment. In this embodiment, the high voltage logic circuit 113 is formed from logic circuits each having two or less inputs. Hence, the problems of the second embodiment, that is, a decrease in the through rate and a decrease in the minimum voltage of the heater power supply voltage that enables a normal operation, do not arise.

In the arrangement shown in FIG. 13, two separate leveled up signals are input to two 2-input NOR circuits 901a, respectively. The outputs from the two 2-input NOR circuits 901a are input to a 2-input NOR circuit 901b. A driving element 112 is controlled by the output from the 2-input NOR circuit 901b. A leveled up shutdown signal (SD) is input to one input of each 2-input NOR circuit 901a.

In this embodiment, the 2-input NOR circuits 901a configured to receive the shutdown signal (SD) immediately after leveled up are provided, thereby avoiding the logic of the high voltage logic circuit 113 from becoming indefinite at the time of power shutdown.

At the time of power shutdown, both NMOSs 401 of a 2-input level converter 122 are turned off by a voltage of 0 V applied to their gates, as shown in FIG. 16A. Hence, no through current flows to this element. On the other hand, if an intermediate voltage is input by indefinite logic, a through current may flow to the logic circuits in the high voltage logic circuit 113. The unwanted through current in the high voltage logic circuit 113 has a high voltage and large energy. It is therefore necessary to reliably avoid the indefinite logic.

When the arrangement like this embodiment is employed, it is possible to reliably avoid supply of an unwanted current to the circuit. Hence, more reliable heater driving control can be performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-116247, filed May 31, 2013, which is hereby incorporated by reference herein in its entirety.

What is claimed is:

1. An element substrate including a plurality of printing elements to which a first voltage is applied, a plurality of driving elements provided in correspondence with the plurality of printing elements and configured to drive the plurality of printing elements, a plurality of logic circuits configured to generate, based on an externally input signal, a selection signal used to select and drive the plurality of printing elements, and a plurality of first level converters provided in correspondence with the plurality of logic circuits and configured to boost a logic voltage having a second voltage lower than the first voltage of the selection signal, comprising:
   a pad configured to externally receive a detection signal indicating detection of drop of the logic voltage;
   a second level converter configured to receive the detection signal via said pad and boost the detection signal; and
   a plurality of high voltage logic circuits provided in correspondence with the plurality of driving elements and the plurality of first level converters and configured to receive the boosted selection signals respectively output from the plurality of first level converters and the detection signal boosted by said second level converter, perform a logical operation of the boosted selection signals and the boosted detection signal and, output a result of the logical operation, and drive the plurality of driving elements,
   wherein when the detection signal is input, said plurality of high voltage logic circuits inhibit driving of the plurality of driving elements regardless of the boosted selection signals.

2. The element substrate according to claim 1, wherein each of said plurality of high voltage logic circuits includes a 2-input NOR circuit.

3. The element substrate according to claim 1, wherein a third voltage lower than the first voltage and higher than the second voltage is used for operations of the plurality of first level converters and said second level converter.

4. The element substrate according to claim 1, wherein a matrix configuration is employed to select the plurality of printing elements, and
   each of said plurality of high voltage logic circuits receives a data signal and a block selection signal as the selection signal.

5. The element substrate according to claim 4, wherein each of said plurality of high voltage logic circuits includes a 3-input NOR circuit,
   said NOR circuit receiving the data signal, the block selection signal, and the detection signal boosted by said second level converter and performing the logical operation.

6. The element substrate according to claim 4, wherein each of said plurality of high voltage logic circuits includes three 2-input NOR circuits,
   two of said three NOR circuits receiving the data signal and the detection signal boosted by said second level converter, and the block selection signal and the detection signal boosted by said second level converter, respectively, and performing the logical operation, and
   a remaining one of said three NOR circuits receiving outputs from said two NOR circuits and performing the logical operation.

7. The element substrate according to claim 1, wherein each of said plurality of high voltage logic circuits includes a 2-input NAND circuit.

8. The element substrate according to claim 4, wherein each of said plurality of high voltage logic circuits includes a 3-input NAND circuit.

9. The element substrate according to claim 1, wherein a pull-down resistor is connected to said pad, and the detection signal is pulled down.

10. The element substrate according to claim 9, wherein said second level converter outputs an inverted output.

11. A printhead configured to arrange a plurality of element substrates according to claim 1 in an arrayed direction of a plurality of printing elements so as to form a full-line printhead having a print width corresponding to a width of a print medium.

12. The printhead according to claim 11, wherein the full-line printhead comprises an inkjet printhead configured to discharge ink to the print medium and print an image.

13. A printing apparatus for printing by using a full-line printhead according to claim 11, comprising:
   a logic circuit power supply configured to supply the logic voltage;
   a detection unit configured to detect drop of the logic voltage; and
   an output unit configured to output the detection by said detection unit to the full-line printhead as the detection signal.

* * * * *